(12) United States Patent
Sabnis et al.

(10) Patent No.: US 6,869,747 B2
(45) Date of Patent: Mar. 22, 2005

(54) ORGANIC POLYMERIC ANTIREFLECTIVE COATINGS DEPOSITED BY CHEMICAL VAPOR DEPOSITION

(75) Inventors: Ram W. Sabnis, Rolla, MO (US); Douglas J. Guerrero, Rolla, MO (US); Terry Brewer, Rolla, MO (US); Mary J. Spencer, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 208 days.

(21) Appl. No.: 10/185,623

(22) Filed: Jun. 28, 2002

(65) Prior Publication Data

US 2003/0049566 A1 Mar. 13, 2003

Related U.S. Application Data

(60) Division of application No. 09/745,350, filed on Dec. 21, 2000, which is a continuation-in-part of application No. 09/511,421, filed on Feb. 22, 2000, now abandoned.

(51) Int. Cl.[7] ............................. G03F 7/00; C23C 14/00
(52) U.S. Cl. .................. 430/270.1; 430/290; 430/311; 430/950; 106/287.27; 427/255.28
(58) Field of Search ....................... 430/290, 270.1, 430/311, 950; 106/287.27; 427/255.28

(56) References Cited

U.S. PATENT DOCUMENTS

| | | | | |
|---|---|---|---|---|
| 3,896,133 A | * | 7/1975 | Craig et al. | 546/203 |
| 3,900,600 A | * | 8/1975 | Spaulding | 427/99 |
| 4,187,318 A | * | 2/1980 | Dreikorn | 514/658 |
| 5,137,780 A | | 8/1992 | Nichols et al. | 428/336 |
| 5,169,494 A | | 12/1992 | Hashimoto et al. | 156/661.1 |
| 5,198,153 A | | 3/1993 | Angelopoulos et al. | 252/500 |
| 5,302,548 A | | 4/1994 | Watanabe et al. | 437/187 |
| 5,443,941 A | | 8/1995 | Bariya et al. | 430/313 |
| 5,545,588 A | | 8/1996 | Yoo | 437/187 |
| 5,583,131 A | * | 12/1996 | Bridger et al. | 514/183 |
| 5,733,712 A | | 3/1998 | Tanaka et al. | 430/314 |
| 5,968,324 A | | 10/1999 | Cheung et al. | 204/192.28 |
| 6,063,547 A | | 5/2000 | Ye et al. | 430/313 |

FOREIGN PATENT DOCUMENTS

JP 11-049784 * 2/1999 ............. C07F/7/08

* cited by examiner

*Primary Examiner*—Mark F. Huff
*Assistant Examiner*—Nicole Barreca
(74) *Attorney, Agent, or Firm*—Hovey Williams LLP

(57) ABSTRACT

An improved method for applying organic antireflective coatings to substrate surfaces and the resulting precursor structures are provided. Broadly, the methods comprise chemical vapor depositing (CVD) an antireflective compound on the substrate surface. In one embodiment, the compound is highly strained (e.g., having a strain energy of at least about 10 kcal/mol) and comprises two cyclic moieties joined to one another via a linkage group. The most preferred monomers are [2.2](1,4)-naphthalenophane and [2.2](9,10)-anthracenophane. The CVD processes comprise heating the antireflective compound so as to vaporize it, and then pyrolizing the vaporized compound to form stable diradicals which are subsequently polymerized on a substrate surface in a deposition chamber. The inventive methods are useful for providing highly conformal antireflective coatings on large substrate surfaces having super submicron (0.25 μm or smaller) features.

2 Claims, 6 Drawing Sheets

ORGANIC POLYMERIC ANTIREFLECTIVE COATINGS DEPOSITED BY CHEMICAL VAPOR DEPOSITION

RELATED APPLICATIONS

This application is a divisional of U.S. patent application Ser. No. 09/745,350, filed Dec. 21, 2000, which is a continuation-in-part of U.S. patent application Ser. No. 09/511,421, filed Feb. 22, 2000, now abandoned, both incorporated by reference herein.

BACKGROUND OF THE INVENTION

1. Field of the Invention

The present invention is broadly concerned with methods of forming antireflective coating (ARC) layers on silicon and dielectric materials as well as the resulting integrated circuit precursor structures. More particularly, the inventive methods comprise providing a quantity of a highly strained antireflective compound and vaporizing that compound. The resulting vapor is then pyrolized to form stable diradicals which are subsequently polymerized on the surface of a substrate. A photoresist layer is applied to the formed ARC layer, and the remaining microphotolithographic process steps carried out.

2. Description of the Prior Art

Integrated circuit manufacturers are constantly seeking to maximize silicon wafer size and minimize device feature dimensions in order to improve yield, reduce unit case, and increase on-chip computing power. Device feature sizes on silicon chips are now submicron in size with the advent of advanced deep ultraviolet (DUV) microlithographic processes. However, reducing the substrate reflectivity to less than 1% during photoresist exposure is critical for maintaining dimension control of these submicron features. Therefore, light absorbing organic polymers are formed into antireflective coating (ARC) compositions which are applied beneath photoresist layer in order to reduce the reflectivity normally encountered from the semiconductor substrates during the photoresist DUV exposure. These organic ARCs are typically applied to the semiconductor substrates by a process called spincoating. While spincoated ARC layers offer excellent reflectivity control, their performance is limited by their nonuniformity, defectivity and conformality constrictions, and other inefficiencies inherent within the spincoating process. As the industry approaches adoption of eight-inch or even twelve-inch semiconductor substrates, the inherent inefficiencies of the spincoating process will become increasingly magnified.

Another problem with the current ARC application processes is inadequate coating uniformity across the wafer. The formed layers are typically lacking in uniformity in that the thickness of the layer at the edges thereof is greater than the thickness at the center of the substrate.

Spincoated ARC layers also tend to planarize or unevenly coat surface topography rather than form highly conformal layers (i.e., layers which evenly coat each aspect of the substrate and the features). For example, if an ARC with a nominal layer thickness of 1000 Å is spincoated over raised features having feature heights of 0.25 microns, the layer may prove to be only 350 Å thick on top of the features, while being as thick as 1800 Å in the troughs located between the raised features.

When planarization occurs with these ultra microscopic feature sizes, the ARC layer is too thin on the top of the features to provide the desired reflection control at the features. At the same time, the layer is too thick in the troughs to permit efficient layer removal during subsequent plasma etch. That is, in the process of clearing the ARC deposit from the troughs by plasma etch, the sidewalls of the resist features become eroded, producing microscopically-sized, but significant, changes in the feature shape and/or dimensions. Furthermore the resist thickness and edge acuity may be lost, which can lead to inconsistent images or feature patterns as the resist pattern is transferred into the substrate during subsequent etching procedures.

Other problems can occur as well due to the fact that spincoating of these ultra thin ARC layers takes place at very high speeds in a dynamic environment. Accordingly, pinholes, voids, striations, bubbles, localized poor adhesion, center-to-edge thickness variations, and other defects occur as a consequence of attendant rapid or non-uniform solvent evaporation, dynamic surface tension, and liquid-wavefront interaction with surface topography. The defects stemming therefrom become unacceptable with increased wafer size (e.g., 8"–12") and when patterning super submicron (0.25 $\mu$m or smaller) features.

There is a need for an improved process of depositing ARC on various substrates which overcomes the drawbacks inherent in spincoating.

SUMMARY OF THE INVENTION

The present invention overcomes these problems by broadly providing improved methods of applying antireflective coatings to silicon and dielectric materials or other substrates (e.g., Al, W, WSi, GaAs, SiGe, Ta, TaN, and other reflective surfaces) utilized in circuit manufacturing processes.

In more detail, the inventive methods comprise depositing an antireflective compound in a layer on the substrate surface by chemical vapor deposition (CVD) processes. A layer of photoresist is then preferably applied to the antireflective layer to form a precursor structure which then be subjected to the remaining steps of the circuit manufacturing process (i.e., applying a mask to the photoresist layer, exposing the photoresist layer to radiation at the desired wavelength, developing and etching the photoresist layer).

In one embodiment the antireflective compound comprises respective light attenuating compounds comprising two cyclic moieties joined via a linkage group bonded to a first location (either directly to a member of the cyclic ring, or to a functional group bonded to the cyclic ring) on one of the cyclic moieties and further bonded to a first location on the other of the cyclic moieties. Preferably, the two cyclic moieties are joined by more than one such linkage group, and even more preferably the two selected moieties are joined by two such linkage groups, with each additional linkage group being bonded to second, third, etc. locations on the respective cyclic moieties.

The light attenuating compounds should be highly strained so that they can be cleaved into stable diradicals upon exposure to energy (e.g., heat, UV light). Thus, the strain energy of the light attenuating compounds should be at least about 10 kcal/mol, preferably at least about 20 kcal/mol, and more preferably from about 30–50 kcal/mol.

It is preferred that at least one of the cyclic moieties be aromatic or heterocyclic, with preferred aromatic moieties being those selected from the group consisting of benzene, naphthalene, anthracene, phenanthrene, and pyrene. Preferred heterocyclic moieties include those selected from the group consisting of pyridine, pyridazine, pyrimidine, pyrazine, thiazole, isothiazole, oxazole, isooxazole, thiophene, furan, and pyrrole.

Formula I schematically depicts the preferred light attenuating compound structure.

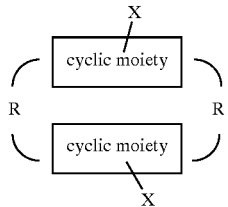

Formula I wherein:

R represents a linkage group and each R is preferably individually selected from the group consisting of alkyl groups (preferably at least $C_2$, and more preferably from about $C_2$–$C_4$); and each X is individually selected from the group consisting of the hydrogen, the halogens, substituted and unsubstituted phenyl groups, substituted and unsubstituted alkyl groups (preferably $C_1$–$C_8$), nitro groups, substituted and unsubstituted amino groups, acetamido groups, substituted and unsubstituted cyclic and heterocyclic groups, and $COR^1$, where $R^1$ is selected from the group consisting of hydrogen, substituted and unsubstituted phenyl groups, substituted and unsubstituted alkyl groups (preferably $C_1$–$C_8$), cinnamoyl, naphthoyl, acryloyl, methacryloyl, furoyl, and thiophenecarbonyl groups.

The most preferred R is an ethyl, propyl, or butyl group. The most preferred X is selected from the group consisting of phenyl, methyl phenyl, methoxyphenyl, nitroxy phenyl, cinnamoyl, naphthoyl, naphthoyl, acryloyl, methacryloyl, furoyl, and thiophenecarbonyl groups.

In one embodiment, the light attenuating compound is formed by reacting at least two cyclic compounds with a halogenating agent (e.g., a brominating or chlorinating agent) in the presence of a catalyst (such as benzoyl peroxide or cetyltrimethylammoniumbromide) and a solvent (such as carbon tetrachloride) so as to halogenate the cyclic compounds. The halogenated cyclic compounds are then reacted with a "bridging" compound (such as sodium iodide) so as to yield an antireflective compound comprising two cyclic moieties joined via a linkage group bonded both to a first location on one of the cyclic moieties and to a first location on the other of the cyclic moieties. In another embodiment, an alkyl-donating compound (e.g., paraformaldehyde) capable of reacting with the cyclic compounds so as to add a $C_1$ or higher alkyl group to each of said cyclic compounds is also present during the reaction.

In another embodiment, the light attenuating compound is 1,4-dixylylene. In yet another embodiment, the antireflective compound comprises 1,4-dixylylene having two to four halogen atoms (e.g., chlorine) bonded thereto, or xylenes having at least one functional group bonded thereto, wherein the functional group is readily cleaved during the CVD process. Formula II schematically depicts the monomer of this embodiment.

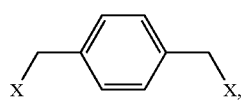

Formula II where each X is individually selected from the group consisting of:

(1) the halogens;

(2)

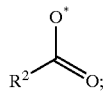

(3)

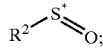

(4)

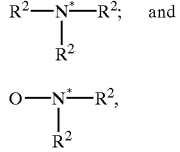

(5)

O—N*—R²,
|
R² where each $R^2$ is individually selected from the group consisting of hydrogen and alkyl groups (preferably $C_1$–$C_4$) and the "*" designates the atom which is bonded to the $CH_2$ group which, in turn, is bonded to the benzene ring as depicted in Formula II.

The chemical vapor deposition process to which the antireflective compound is subjected comprises subjecting the compound to sufficient temperatures and pressures so as to cause the solid compound to sublime to form a vapor. This is preferably accomplished by heating the compound to a temperature of from about 35–250° C., and more preferably from about 60–150° C., at a base pressure of from about 2–50 mTorr, and more preferably from about 5–25 mTorr, over the course of the entire process. Even more preferably, this heating is accomplished by running a temperature gradient wherein the temperature is raised about 10° C. about every 5 minutes followed by a dwell time at the particular temperature for about another 5 minutes. When the temperature is close to the melting point of the cyclic moiety (e.g., within about 2° C.), the temperature is raised about 5° C. during the course of about 5 minutes after which the temperature is maintained for about 4–6 minutes.

The resulting vapor is then subjected to a process whereby the light attenuating compounds in the vapor are cleaved. Preferably, this cleavage is effected by pyrolizing the light attenuating compound by heating it to a temperature of from about 580–1000° C., and more preferably from about 900–960 ° C. The light attenuating compounds should be cleaved at the bond between two carbon atoms on each linkage group so as to yield stable diradicals.

Finally, the cleaved compounds or diradicals are caused to polymerize on the surface of the substrate. This is preferably accomplished by introducing the cleaved compounds into an ambient-temperature, deposition chamber in the presence of the desired substrate where the cleaved compounds are simultaneously adsorbed and polymerized on the substrate surface. This step is preferably accomplished at a temperature of from about 20–25 ° C., with the spin speed of the rotating shelf on which the substrate is situated preferably being revolved from about 2–10 rpm, and more preferably from about 2–5 rpm.

The equipment utilized to carry out the foregoing CVD process can be any conventional CVD equipment so long as the above-described temperatures can be attained by the equipment. The primary modification required for conventional CVD equipment is that the deposition chamber must be modified to accommodate the particular size of the substrate (e.g., an 8-inch silicon wafer), and it must include a mechanism for rotating the substrate (such as a rotating shelf) at a speed of about 2 rpm.

The resulting precursor structures have antireflective coating layers which are surprisingly defect-free. Thus, there are less than 0.1 defects/cm² of antireflective layer (i.e., less than about 30 defects per 8-inch wafer), and preferably less than 0.05 defects/cm² (i.e., less than about 15 defects per 8-inch wafer), when observed under an optical microscope. Furthermore, these essentially defect-free films can be achieved on 6–12 inch substrates having super submicron features (less than about 0.25 µm in height). As used herein, the term "defects" is intended to include pinholes, dewetting problems where the film doesn't coat the surface, and so-called "comets" in the coating where a foreign particle contacts the substrate surface causing the coating to flow around the particle.

The antireflective layers prepared according to the invention can be formulated to have a thickness of from about 300–5000 Å, and can also be tailored to absorb light at the wavelength of interest, including light at a wavelength of from about 150–500 nm (e.g., 365 nm or i-line wavelengths, 435 nm or g-line wavelengths, 248 nm deep ultraviolet wavelengths, and 193 nm wavelengths), and preferably from about 190–300 nm. Thus, the antireflective layers will absorb at least about 90%, and preferably at least about 95%, of light at wavelengths of from about 150–500 nm. Furthermore, the antireflective layers have a k value (the imaginary component of the complex index of refraction) of at least about 0.1, preferably at least about 0.35, and more preferably at least about 0.4 at the wavelength of interest.

The deposited antireflective layer is also substantially insoluble in solvents utilized in the photoresist which is subsequently applied to the antireflective layer. That is, the thickness of the layer will change by less than about 10%, and preferably less than about 5% after contact with the photoresist solvent. As used herein, the percent change is defined as:

$$100 \cdot \frac{|(\text{thickness prior to solvent contact}) - (\text{thickness after solvent contact})|}{(\text{thickness prior to solvent contact})}$$

The antireflective layers deposited on substrate surfaces according to the invention are also highly conformal, even on topographic surfaces (as used herein, surfaces having raised features of 1000 Å or greater and/or having contact or via holes formed therein and having hole depths of from about 1000–15,000 Å). Thus, the deposited layers have a percent conformality of at least about 85%, preferably at least about 95%, and more preferably about 100%, wherein the percent conformality is defined as:

$$100 \cdot \frac{|(\text{thickness of the film at location A}) - (\text{thickness of the film at location B})|}{(\text{thickness of the film at location A})},$$

wherein: "A" is the centerpoint of the top surface of a target feature when the target feature is a raised feature, or the centerpoint of the bottom surface of the target feature when the target feature is a contact or via hole; and "B" is the halfway point between the edge of the target feature and the edge of the feature nearest the target feature. When used with the definition of percent conformality, "feature" and "target feature" is intended to refer to raised features as well as contact or via holes. As also used in this definition, the "edge" of the target feature is intended to refer to the base of the sidewall forming the target feature when the target feature is a raised feature, or the upper edge of a contact or via hole when the target feature is a recessed feature.

Finally, in addition to the aforementioned antireflective layer properties, the instant invention has a further distinct advantage over prior art spin-coating methods which utilize large quantities of solvents. That is, the instant methods avoid spin-coating solvents which often require special handling. Thus, solvent waste is minimized and so are the negative effects that solvent waste can have on the environment. Furthermore, overall waste is minimized with the inventive process wherein substantially all of the reactants are consumed in the process.

DETAILED DESCRIPTION OF THE PREFERRED EMBODIMENTS

EXAMPLES

Figure 1:
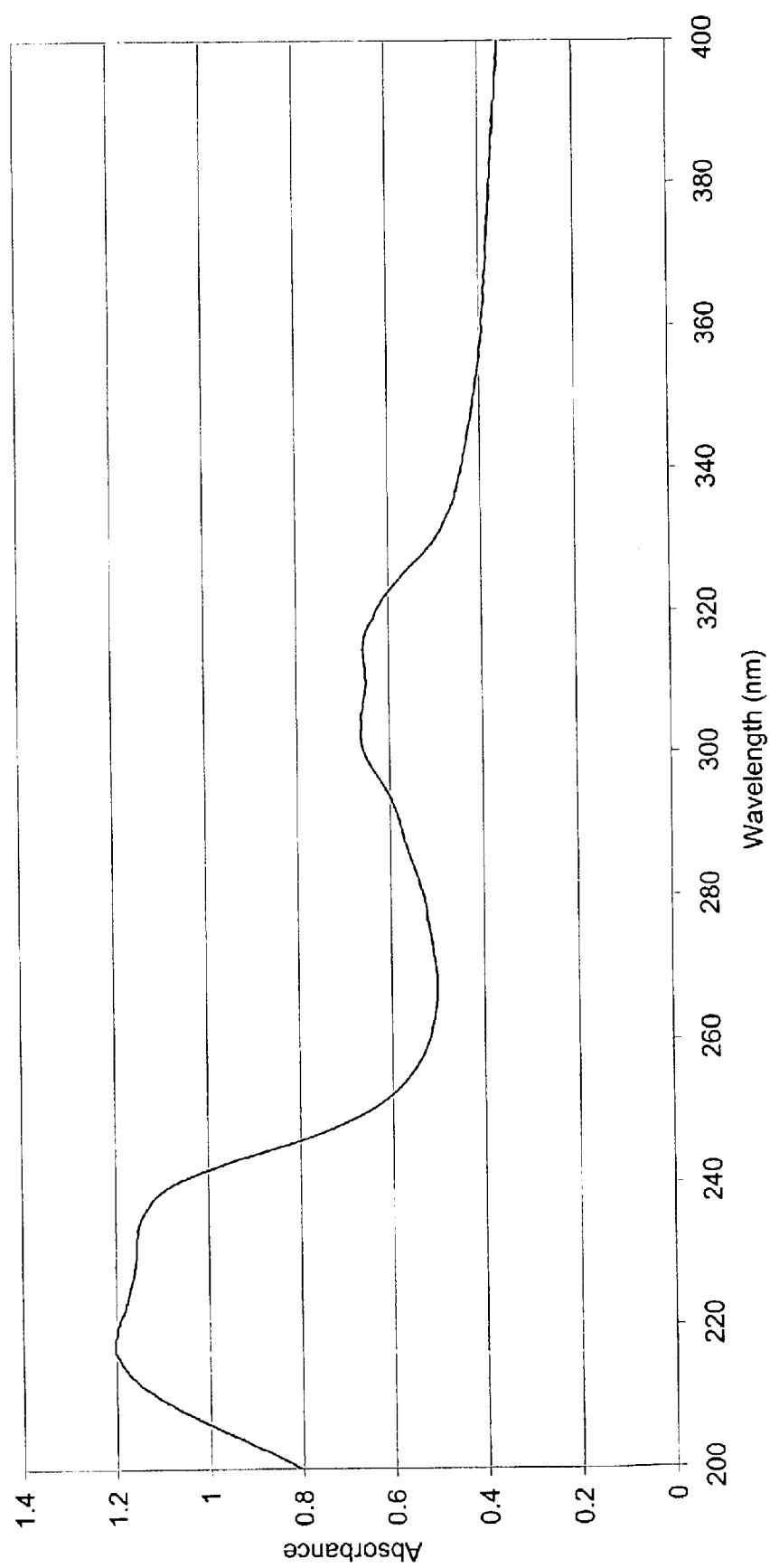
FIG. 1 is a graph depicting the ultraviolet-visible (UN-Vis) spectrum of a [2.2](1,4)-naphthalenophane film deposited on a quartz slide.

The following examples set forth preferred methods in accordance with the invention. It is to be understood, however, that these examples are provided by way of illustration and nothing therein should be taken as a limitation upon the overall scope of the invention.

Example 1

Synthesis of [2.2](1,4)-Naphthalenophane

A mixture of 1,4-dimethylnaphthalene (12.5 g, 0.08 mol), N-bromosuccinimide (30.6 g, 0.17 mol—a brominating agent), and benzoyl peroxide (0.4 g—a catalyst) in carbon tetrachloride (70 ml) was stirred and refluxed for 1 hour. The reaction mixture was cooled to room temperature, and the precipitate was filtered and washed with carbon tetrachloride. A suspension was formed by stirring this solid with water (500 ml) for 45 min. followed by filtering, washing with water, and drying. Recrystallization from ethyl acetate furnished pure 1,4-bis(bromomethyl)naphthalene in 86% yield and with a melting point of 188° C.

Next, 1,4-bis(bromomethyl)naphthalene was extracted (Soxhlet) into a refluxing solution of sodium iodide (15 g) in acetone (250 ml) for 24 hrs. The solvent was evaporated on a rotary evaporator until the overall reaction mixture volume was around 50 ml, and then the mixture was poured into 150 ml of water. Sodium thiosulfate was added until the color changed to white followed by filtering and drying. Recrystallization from dichloromethane furnished pure [2.2](1,4)-naphthalenophane in 61% yield and having a melting point of 296–300° C. (see Structure A). $^1$H-NMR (CDCl$_3$); δ 2.99–3.02 (m, 4H, CH$_2$), 3.72–3.74 (m, 4H, CH$_2$), 7.39–7.42 (m, 6H aromatic), 7.71–7.74 (m, 6H, aromatic) ppm. The elemental analysis calculated for C$_{24}$H$_{20}$: C-93.50 and H-6.49; found: C-93.24 and H-6.48.

Structure A

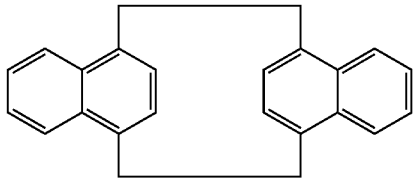

Example 2

Synthesis of 4-Substituted-[2.2](1,4)-Naphthalenophane

A mixture of anhydrous, finely powdered aluminum chloride (0.004 mol) was stirred in dichloromethane (100 ml), followed by slow addition of the corresponding aryl or heteroaryl acid chloride (0.0037 mol) over a period of 30 min. Next, [2.2](1,4)-naphthalenophane (0.003 mol) was slowly added. The reaction mixture was stirred and refluxed for 5–9 hrs. The mixture was cooled to room temperature and poured over a mixture of ice water and 20 ml of concentrated hydrochloric acid. The mixture was poured into a separatory funnel. The organic layer was washed with dilute sodium hydroxide solution, then washed with water, and finally dried over anhydrous magnesium sulfate. Finally, the organic layer was evaporated on a rotary evaporator to isolate pure 4-substituted-[2.2](1,4)-naphthalenophane (see Structure B) in a 63–89% yield. The respective structures of the compounds were confirmed by IR, NMR, and elemental analyses.

Structure B

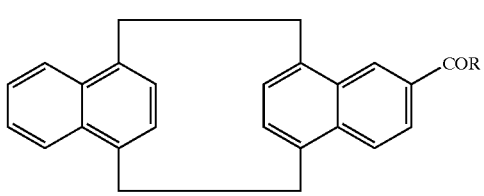

wherein, R is C$_6$H$_5$, 4-Me—C$_6$H$_4$, 4-MeO—C$_6$H$_4$, 4-NO$_2$—C$_6$H$_4$, cinnamoyl, 1-naphthoyl, 2-naphthoyl, acryloyl, methacryloyl, 2-furoyl, or 2-thiophenecarbonyl.

Example 3

Synthesis of [2.2](2,6)-Naphthalenophane

A mixture of 2,6-dimethylnaphthalene (12.5 g, 0.08 mol), N-bromosuccinimide (30.6 g, 0.17 mol), and benzoyl peroxide (0.4 g) in carbon tetrachloride (70 ml) was stirred and refluxed for 1 hour. The reaction mixture was cooled to room temperature and the precipitate was filtered and then washed with carbon tetrachloride. A suspension was formed by stirring this solid with water (500 ml) for 45 min. followed by filtering, washing with water, and drying. Recrystallization from ethyl acetate furnished pure 2,6-bis(bromomethyl)naphthalene.

Next, 2,6-bis(bromomethyl)naphthalene was extracted (Soxhlet) into a refluxing solution of sodium iodide (15 g) in acetone (250 ml) for 24 hrs. The solvent was evaporated on a rotary evaporator until the overall reaction mixture volume was around 50 ml, and then the mixture was poured into 150 ml of water. Sodium thiosulfate was added until the color changed to white, followed by filtering and drying. Recrystallization from dichloromethane furnished pure [2.2](2,6)-naphthalenophane (see Structure C) in a 78% yield and with a melting point of 150–152° C. $^1$H-NMR (CDCl$_3$); δ 4.61–4.65 (m, 8H, CH$_2$), 7.46–7.49 (m, 6H, aromatic), 7.72–7.78 (m, 6H aromatic), ppm. The elemental analysis calculated for C$_{24}$H$_{20}$: C-93.50 and H-6.49; found: C-93.11 and H-6.41.

Structure C

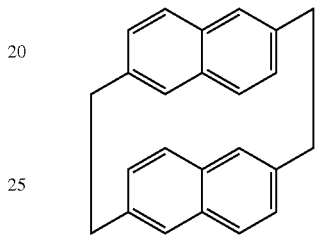

Example 4

Synthesis of [2.2](9,10)-Anthracenophane

A mixture of anthracene (0.1 mol), paraformaldehyde (0.1 mol), cetyltrimethylammoniumbromide (0.4 g), and glacial acetic acid (25 ml) was stirred at room temperature. Next, 60 ml of aqueous HBr (containing 47% HBr gas) was slowly added dropwise to the reaction mixture over a period of 1 hour. The reaction mixture was stirred and heated to 80° C. for 5 hrs., cooled, filtered, washed with water, and then dried. Recrystallization from toluene furnished pure 9,10-bis(bromomethyl)anthracene in a 93% yield and with a melting point of 201° C.

Next, 9,10-bis(bromomethyl)naphthalene was extracted (Soxhlet) into a refluxing solution of sodium iodide (15 g) in acetone (250 ml) for 24 hrs. The solvent was evaporated on a rotary evaporator to isolate the crude product. Recrystallization from chloroform furnished pure [2.2](9,10)-anthracenophane (see Structure D) in a 97% yield and having a melting point of 275° C. $^1$H-NMR (CDCl$_3$); δ 2.94 (s, 8H, CH$_2$), 6.90–6.92 (q, 8H, aromatic), 7.12–7.26 (q, 8H, aromatic) ppm. The elemental analysis calculated for C$_{32}$H$_{24}$: C,94.11; H,5.88; found: C,94.79; H,5.43.

Structure D

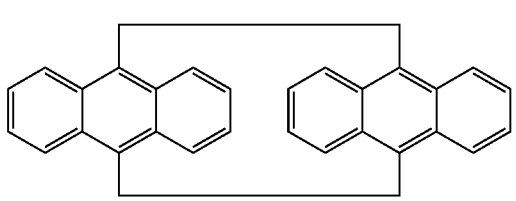

Example 5

Synthesis of 4-Substituted-[2.2](9,10)-Anthracenophane

A mixture of anhydrous, finely powdered aluminum chloride (0.004 mol) was stirred in dichloromethane (100 ml), followed by slow addition of the corresponding aryl orheteroaryl acid chloride (0.0037 mol) overaperiod of30 min. Next, [2.2](9,10)-anthracenophane (0.003 mol) was slowly added. The reaction mixture was stirred and refluxed for 5–9 hrs. The mixture was then cooled to room temperature and poured over ice-water and concentrated hydrochloric acid (20 ml). The mixture was poured into a separatory funnel, and the organic layer was washed with dilute sodium hydroxide solution, then washed with water, and finally dried over anhydrous magnesium sulfate. The organic layer was evaporated on a rotary evaporator to isolate pure 4-substituted-[2.2]-anthracenophane (see Structure E) in a 59–84% yield. The respective structures of the compounds were confirmed by IR, NMR, and elemental analyses.

Structure E

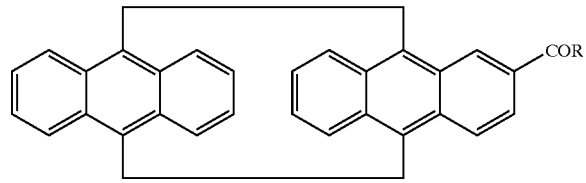

wherein R is $C_6H_5$, 4-Me—$C_6H_4$, 4-MeO—$C_6H_4$, 4-$NO_2$—$C_6H_4$, cinnamoyl, 1-naphthoyl, 2-naphthoyl, acryloyl, methacryloyl, 2-furoyl, 2-thiophenecarbonyl.

Example 6

Characteristic Properties

Part 1

Two major families of compounds were studied as potential chromophores for antireflective coating layers. Those families were [2.2](1,4)-naphthalenophanes and [2.2](9,10)-anthracenophanes. The antireflective coating layers prepared according to Example 1, using [2.2](1,4)-naphthalenophane were CVD polymerized on six- or eight-inch flat silicon wafers, topography wafers, quartz slides, aluminum substrates, tantalum (Ta) substrates, and tantalum nitride (TaN) substrates.

The film thickness of each sample was optically measured by ellipsometry at 25 points on a planar silicon wafer to estimate the mean thickness. The films generated uniform coats, without pinholes, voids, or particles and having a preferred thickness of 1000 Å. The films exhibited thickness uniformities of greater than 98% on the various substrates. The film thickness uniformity data is set forth in Table 1.

TABLE 1

Film Thickness Uniformity

| Sample Number | Mean Thickness (Å) | Standard Deviation (Å) | Thickness Uniformity (%) |
|---|---|---|---|
| 63-154-1A | 828 | 8.17 | 1.00 |
| 63-154-1B | 828 | 8.17 | 1.00 |
| 63-154-1C | 828 | 5.56 | 1.00 |

The deposited antireflective layer was also substantially insoluble in typical photoresist solvents. The solvents evaluated included ethyl lactate and propylene glycol monomethyl ether acetate (PGMEA). No thickness loss was observed with either ethyl lactate and PGMEA. The stripping data is set forth in Table 2.

TABLE 2

Stripping Test

| Sample Number | Solvent (Å) | Initial Thickness (Å) | Final Thickness (Å) | Stripping Estimate (%) |
|---|---|---|---|---|
| 63-152-1A | Ethyl lactate | 380 | 381 | 0.00 |

The ability of the films to remain chemically inert to the photoresist was tested using UV-6 photoresist (manufactured by Shipley Company, Inc.). The photoresist was coated on the antireflective coating layer, exposed, and then developed with LDD26W developer (manufactured by Shipley Company, Inc.). Excellent profiles were obtained using UV-6 photoresist during photolithography.

FIG. 1 is a graph showing the UV-Vis spectrum of the deposited film according to Example 1, using [2.2](1,4)-naphthalenophane on quartz slide. The $\lambda_{max}$ was at 233 nm demonstrating that the [2.2](1,4)-naphthalenophane-based antireflective film is useful for deep UV (248 nm) applications. The optical density was 6.46/μm at 248 nm.

Figure 2:
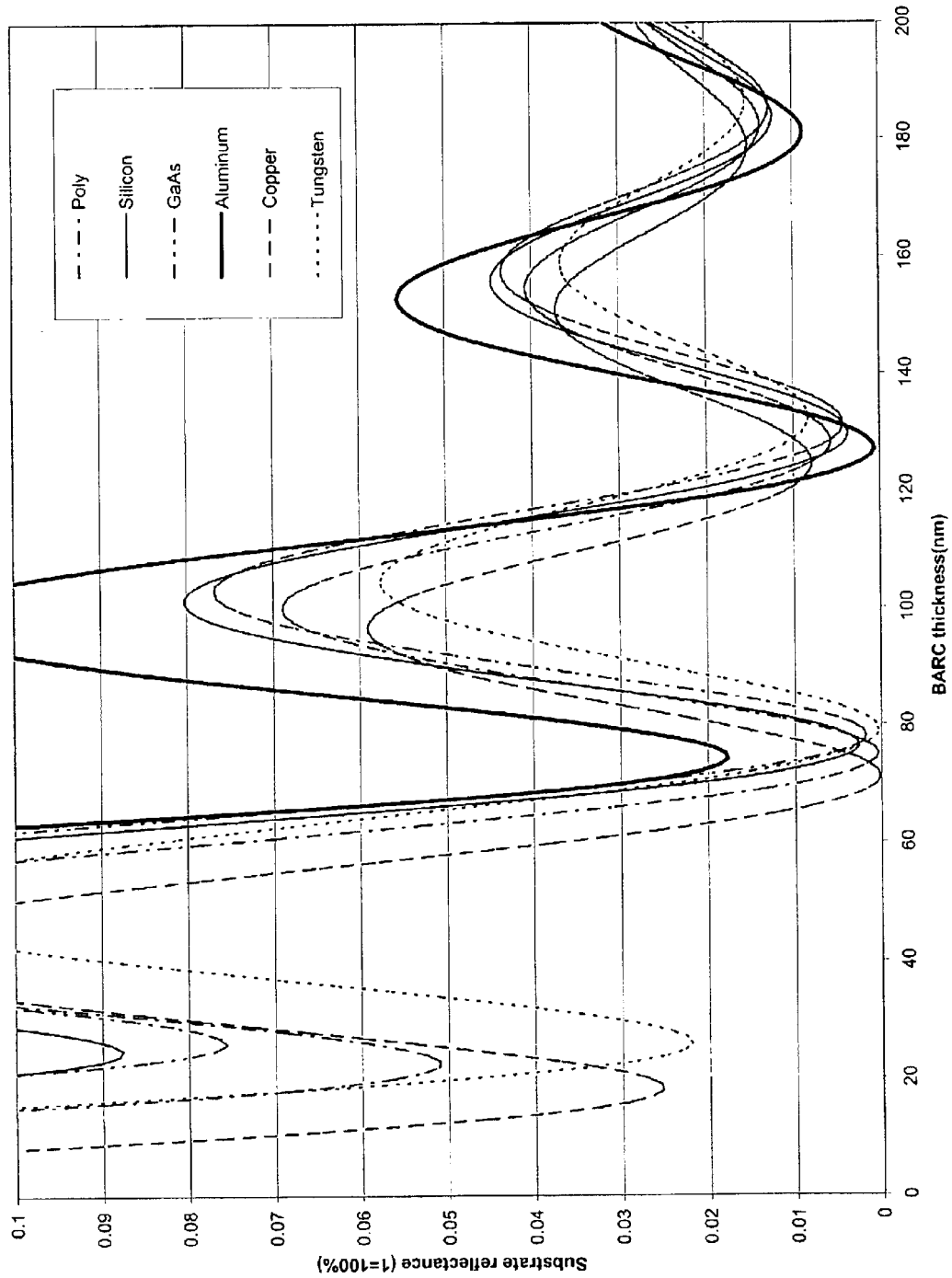
FIG. 2 is a graph showing the reflectance curve of [2.2](1,4)-naphthalenophane on various substrates.

The optical constants were measured by VASE analysis. The average real portion of the refractive index (n) and the imaginary index (k) were determined. The values of real and imaginary refractive index were n=2.29 and k=0.29 at 248 nm. The optical density calculated from the optical constants was 6.46/μm at 248 nm. FIG. 2 is a graph showing the reflectance curve of this film. The first minimum thickness was 775 Å, and the second minimum thickness was 1300 Å.

Figure 3:
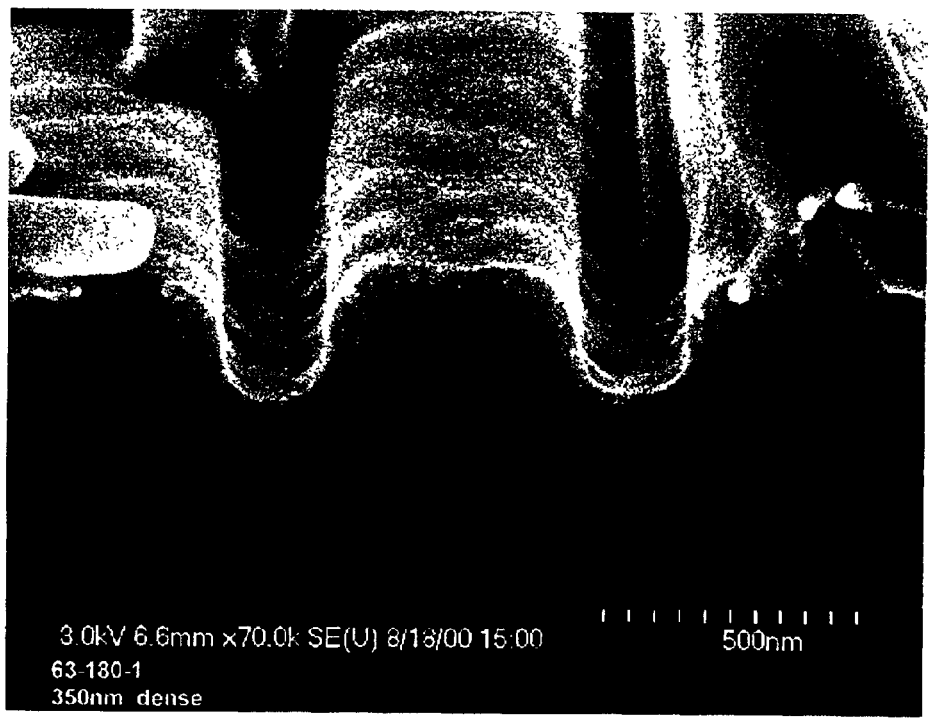
FIG. 3 is a scanning electron microscope (SEM) photograph illustrating the film conformality of an 850 Å thick film of [2.2](1,4)-naphthalenophane on 2000 Å topography.

Film conformality was also tested by depositing [2.2](1,4)-naphthalenophane prepared according to Example 1 onto 2000 Å topography wafers. An examination of the SEM photograph indicated that the film was nearly 98% conformal to the substrates over a topography of 2000 Å in height. FIG. 3 is an SEM photograph showing the film conformality of an 850 Å thick film of [2.2](1,4)-naphthalenophane on a 2000 Å topography.

Figure 4:
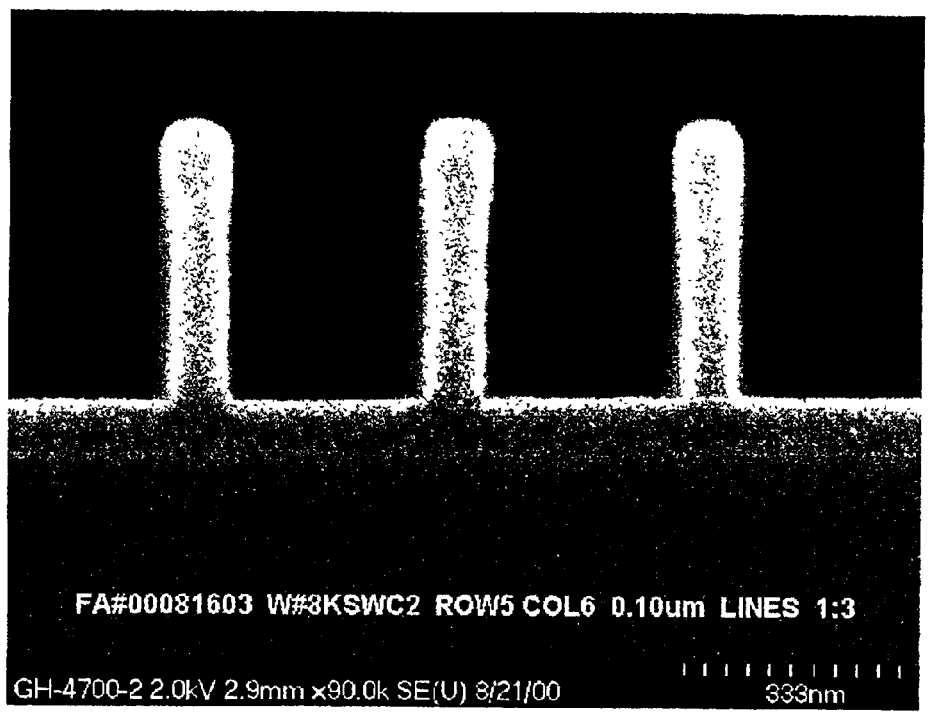
FIG. 4 is an SEM photograph of the resist profile cross-section of a [2.2](1,4)-naphthalenophane-based organic antireflective coating of 930 Å thick film using a commercially available photoresist.

A coating of [2.2](1,4)-naphthalenophane was vapor deposited on a silicon wafer to form a film having a thickness of 930 Å, followed by patterning of a UV-6 photoresist over the BARC and developing with LDD26W. The wafers were then cross-sectioned, and the resist features were examined with a SEM. FIG. 4 is an SEM photograph showing an excellent resist profile cross-section of the [2.2](1,4)-naphthalenophane-based organic antireflective coating of a 930 Å thick film using UV-6 photoresist. Resist profiles as small as 100 nm dense lines and 90 nm isolated lines were achieved.

Part 2

Antireflective coating layers were prepared according to the procedure described in Example 4 using [2.2](9,10)-anthracenophane. These layers were CVD polymerized on six- or eight-inch flat silicon wafers, topography wafers, quartz slides, aluminum substrates, tantalum (Ta) substrates, and tantalum nitride (TaN) substrates.

The film thickness was optically measured by ellipsometry at 25 points on a planar silicon wafer to estimate the mean thickness. The films resulted in a uniform coat, without pinholes, voids, or particles and having a preferred thickness of 1000 Å. The films exhibited a thickness uniformity of greater than 94% on various substrates. The film thickness uniformity data is set forth in Table 3.

TABLE 3

Film Thickness Uniformity

| Sample Number | Mean Thickness (Å) | Standard Deviation (Å) | Thickness Uniformity (%) |
|---|---|---|---|
| 63-167-1A | 377 | 3.55 | 1.00 |
| 63-167-1B | 377 | 2.21 | 1.00 |

The deposited antireflective layer was also substantially insoluble in typical photoresist solvents. The solvents evaluated included ethyl lactate and propylene glycol monomethyl ether acetate (PGMEA). The thickness loss observed using ethyl lactate and PGMEA was well within the target of 50 Å (less than 20%). This stripping data is set forth in Table 4.

TABLE 4

Stripping Test

| Sample Number | Solvent (Å) | Initial Thickness (Å) | Final Thickness (Å) | Stripping Estimate (%) |
|---|---|---|---|---|
| 63-152-1A | Ethyl lactate | 233 | 191 | 18.00 |
| 63-152-1A | PGMEA | 191 | 165 | 14.00 |

The ability of the film to remain chemically inert to the photoresist was also tested using the UV-6 photoresist. The photoresist was coated on the antireflective coating layer, exposed, and then developed with LDD26W developer. Excellent profiles were obtained using the UV-6 photoresist during photolithography. The antireflective coating layers prepared according to the procedure described in Example 4 exhibited excellent adhesion to silicon, aluminum, tantalum, tantalum nitride substrates.

Figure 5:
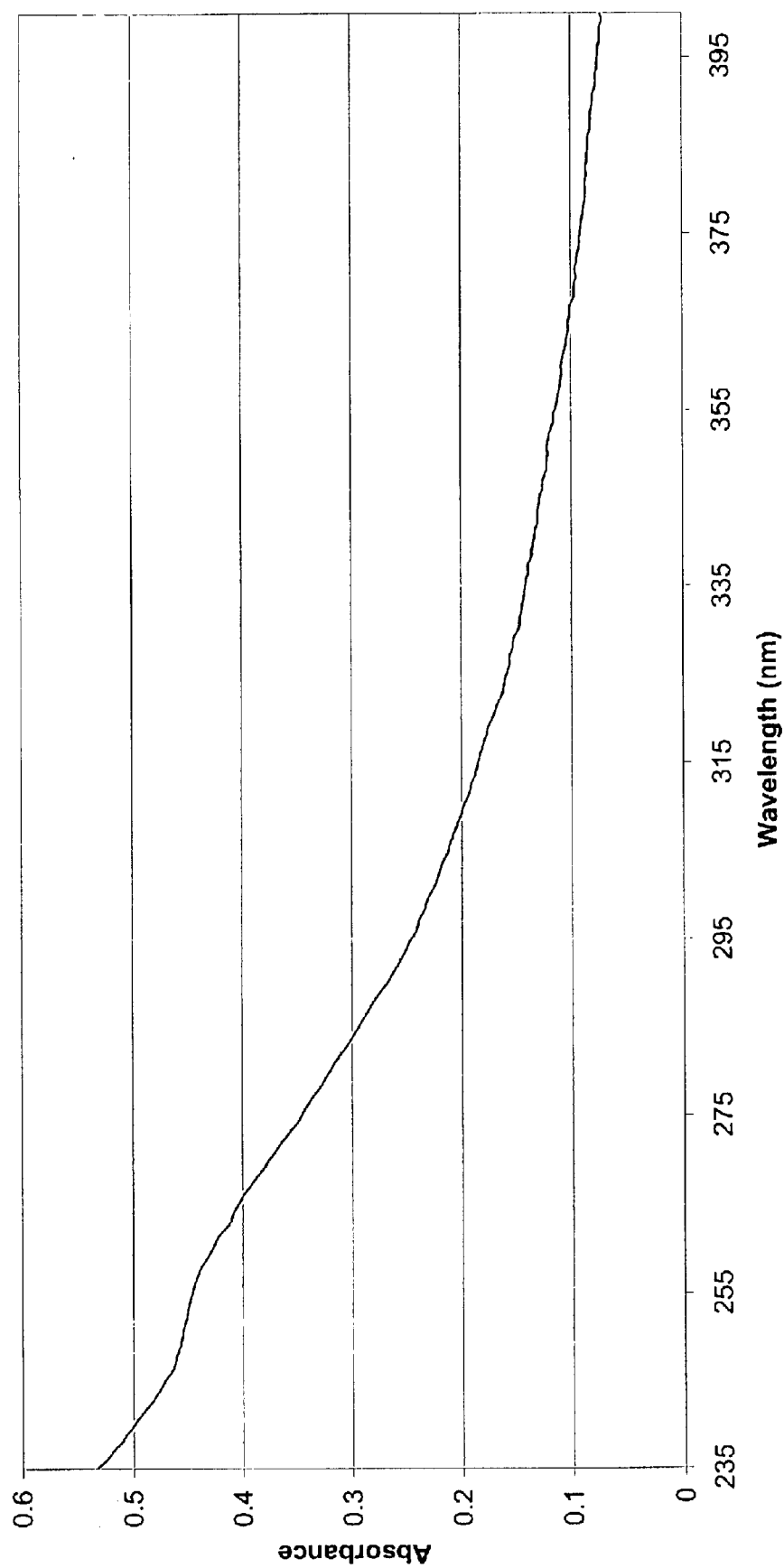
FIG. 5 is a graph depicting the UV-Vis spectrum of a [2.2](9,10)-anthracenophane film deposited on a quartz slide.

FIG. 5 is a graph showing the UV-Vis spectrum of the deposited film according to Example 4 using [2.2](9,10)-anthracenophane on quartz slide. The $\lambda_{max}$ was at 267 nm, thus demonstrating that the [2.2](9,10)-anthracenophane-based antireflective film is useful material for deep UV (248 nm) applications. The optical density was 5.80/μm at 248 nm.

Figure 6:
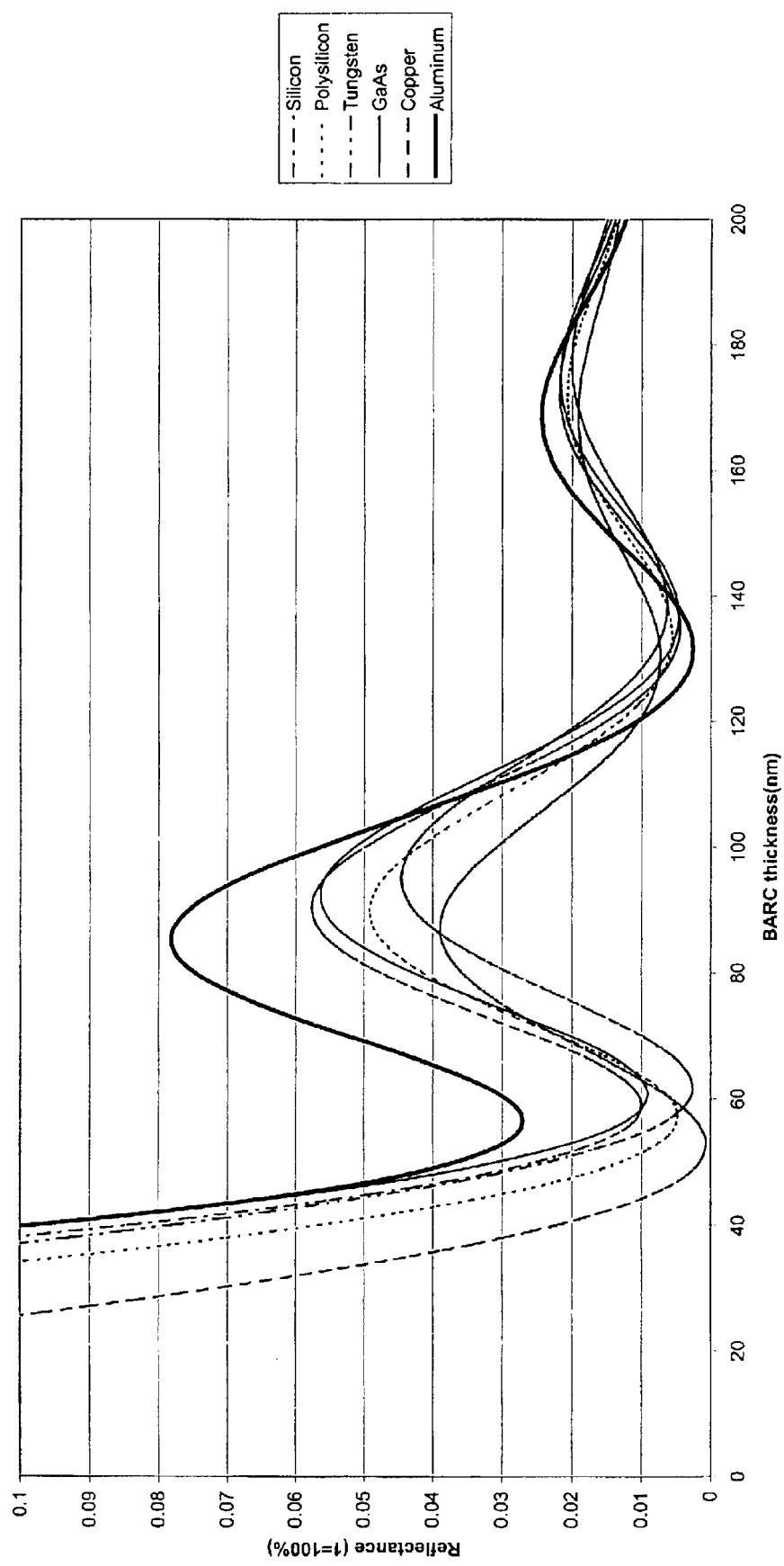
FIG. 6 is a graph showing the reflectance curve of [2.2](9,10)-anthracenophane on various substrates.

The optical constants were measured by VASE analysis. The values of real and imaginary refractive index values were n=1.55 and k=0.36 at 248 nm. The optical density calculated from optical constants was 6.46/μm at 248 nm. FIG. 6 is a graph showing the reflectance curve of this film. The first minimum thickness was 570 Å, and the second minimum thickness was 1300 Å.

Figure 7:
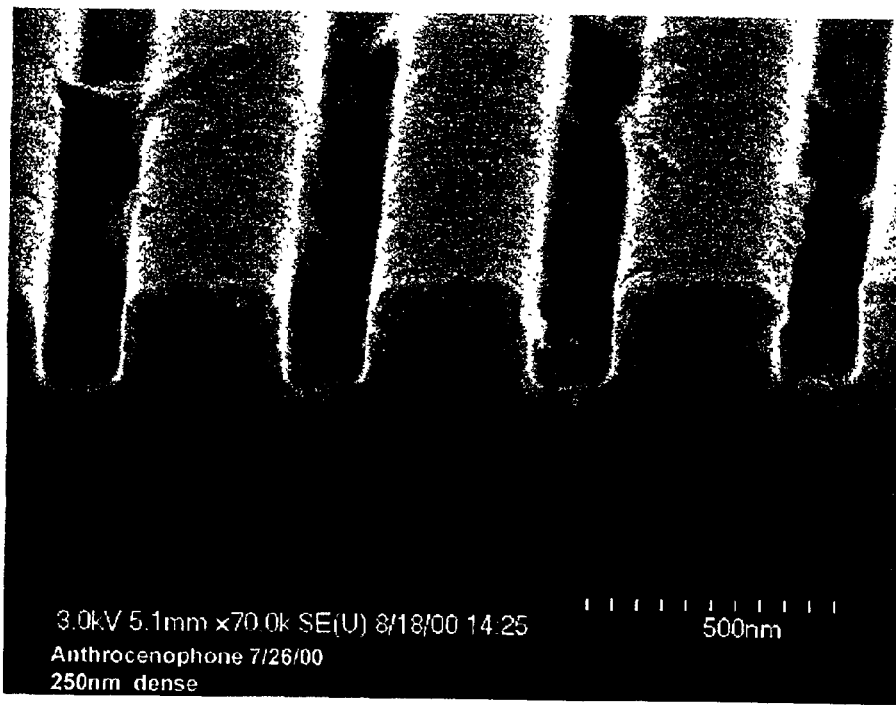
FIG. 7 is an SEM photograph illustrating the film conformality of a 360 Å thick film of [2.2](9,10)-anthracenophane on a 2000 Å topography.

The film conformality was also tested by depositing [2.2](9,10)-anthracenophane (prepared according to the procedure described in Example 4) onto 2000 Å topography wafers. An examination of the SEM photograph indicated that the film was nearly 100% conformal to the substrates over a topography of 2000 Å in height. FIG. 7 is an SEM photograph showing the film conformality of 815 Å thick film of [2.2](9,10)-anthracenophane on a 2000 Å topography.

Figure 8:
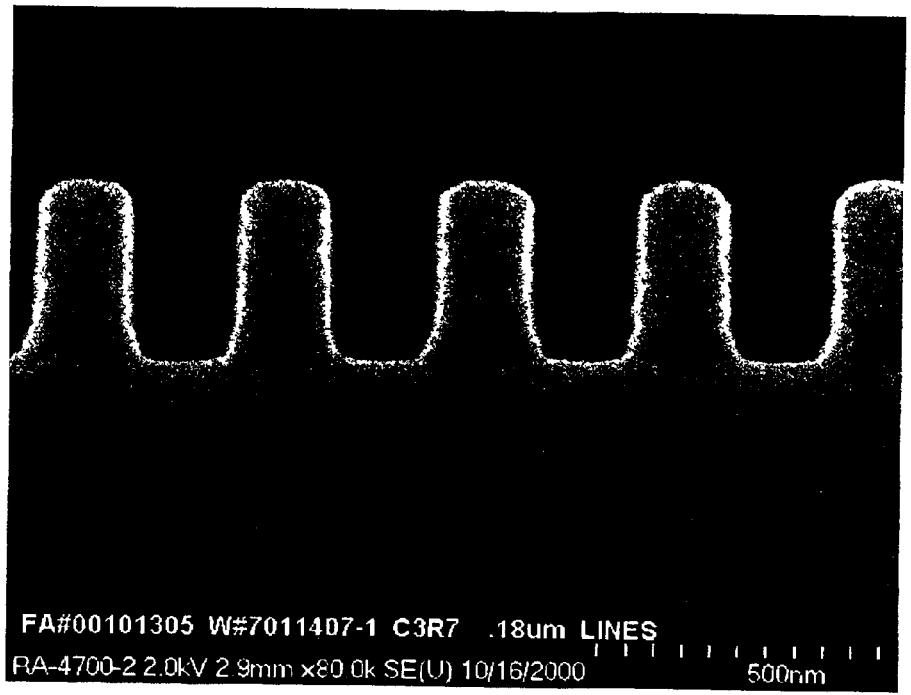
FIG. 8 is an SEM photograph showing the resist profile cross-section of a [2.2](9,10)-anthracenophane-based organic antireflective coating of a 900 Å thick film using a commercially available photoresist.

The coating of [2.2](9,10)-anthracenophane was vapor deposited on a silicon wafer to form a film having a thickness of 900 Å, followed by patterning of a UV-6 photoresist over the BARC and developing with LDD26W. The wafers were cross-sectioned, and then the resist features were examined with an SEM. FIG. 8 is an SEM photograph showing the excellent resist profile cross-section of the [2.2](9,10)-anthracenophane-based organic antireflective coatings of a 900 Å thick film using UV-6 photoresist. Resist profiles as small as 170 nm dense lines were achieved.

In conclusion, it will be appreciated that a number of antireflective compounds can be prepared according to the invention and applied to substrates via chemical vapor deposition processes. These compounds include:

[2.2](1,4)-naphthalenophane and derivatives thereof such as 4-bromo-[2.2](1,4)-naphthalenophane, 4-chloro-[2.2](1,4)-naphthalenophane, 4-fluoro-[2.2](1,4)-naphthalenophane, 4-nitro-[2.2](1,4)-naphthalenophane, 4-amino-[2.2](1,4)-naphthalenophane, 4-acetamido-[2.2](1,4)-naphthalenophane, 4-(1-naphthylcarbonyl)-[2.2](1,4)-naphthalenophane, 4-(2-naphthylcarbonyl)-[2.2](1,4)-naphthalenophane, 4-(phenylcarbonyl)-[2.2](1,4)-naphthalenophane, 4-(4'-methoxy-phenylcarbonyl)-[2.2](1,4)-naphthalenophane, 4-(4'-nitro-phenylcarbonyl)-[2.2](1,4)-naphthalenophane, 4-(cinnamylcarbonyl)-[2.2](1,4)-naphthalenophane, 4-(acrylcarbonyl)-[2.2](1,4)-nephthalenophane, 4-(methacrylcarbonyl)-[2.2](1,4)-naphthalenophane, 4-(2'-furylcarbonyl)-[2.2](1,4)-naphthalenophane, and 4-(2'-thienylcarbonyl-[2.2](1,4)-naphthalenophane;

[2.2](2,6)-naphthalenophane and its monosubstituted derivative; and

[2.2](9,10)-anthracenophane and derivatives thereof such as 4-bromo-[2.2](9,10)-anthracenophane, 4-chloro-[2.2](9,10)-anthracenophane, 4-fluoro-[2.2](9,10)-anthracenophane, 4-nitro-[2.2](9,10)-anthracenophane, 4-amino-[2.2](9,10)-anthracenophane, 4-acetamido-[2.2](9,10)-anthracenophane, 4-(1-naphthylcarbonyl)-[2.2](9,10)-anthracenophane, 4-(2-naphthylcarbonyl)-[2.2](9,10)-anthracenophane, 4-(phenylcarbonyl)-[2.2](9,10)-anthracenophane, 4-(4'-methyl-phenylcarbonyl)-[2.2](9,10)-anthracenophane, 4-(4'-methoxy-phenylcarbonyl)-[2.2](9,10)-anthracenophane, 4-(4'-nitro-phenylcarbonyl)-[2.2](9,10)-anthracenophane, 4-(cinnamylcarbonyl)-[2.2](9,10)-anthracenophane, 4-(acrylcarbonyl)-[2.2](9,10)-anthracenophane, 4-(methacrylcarbonyl)-[2.2](9,10)-anthracenophane, 4-(2'-furylcarbonyl)-[2.2](9,10)-anthracenophane, and 4-(2'-thienylcarbonyl)-[2.2](9,10)-anthracenophane).

We claim:

1. A method of forming a light attenuating compound comprising the steps of:
   reacting at least two cyclic compounds with a halogenating agent so as to halogenate the cyclic compounds, said reacting step being carried out in the presence of:
   cetyltrimethylammoniumbromide;
   a solvent; and
   an alkyl-donating compound capable of reacting with the cyclic compounds so as to add a $C_2$ or higher alkyl group to each of said cyclic compounds; and
   reacting the cyclic compounds so as to yield an antireflective compound comprising two cyclic moieties joined via a linkage group bonded both to a first location on one of the cyclic moieties and to a first location on the other of the cyclic moieties.

2. The method of claim 1, wherein said alkyl-donating compound is paraformaldehyde.

* * * * *

UNITED STATES PATENT AND TRADEMARK OFFICE
CERTIFICATE OF CORRECTION

PATENT NO. : 6,869,747 B2
DATED : March 22, 2005
INVENTOR(S) : Sabnis et al.

It is certified that error appears in the above-identified patent and that said Letters Patent is hereby corrected as shown below:

Column 1,
Line 14, insert the following:
-- FEDERALLY SPONSORED RESEARCH/DEVELOPMENT PROGRAM
    This invention was made with Government support under contract DASG60-01-C-0047 awarded by the United States Army Space and Missile Defense Command. The Government has certain rights in the invention. --.

Signed and Sealed this

Sixteenth Day of May, 2006

JON W. DUDAS
*Director of the United States Patent and Trademark Office*